(12) United States Patent
Chu et al.

(10) Patent No.: US 6,775,137 B2
(45) Date of Patent: Aug. 10, 2004

(54) METHOD AND APPARATUS FOR COMBINED AIR AND LIQUID COOLING OF STACKED ELECTRONICS COMPONENTS

(75) Inventors: Richard C. Chu, Hopewell Junction, NY (US); Michael J. Ellsworth, Jr., Lagrangeville, NY (US); Edward Furey, Kingston, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/303,284

(22) Filed: Nov. 25, 2002

(65) Prior Publication Data

US 2004/0100770 A1 May 27, 2004

(51) Int. Cl.[7] ................................................. G06F 1/16
(52) U.S. Cl. ........................ 361/696; 361/692; 361/695; 361/687; 165/120; 165/134; 312/223.2
(58) Field of Search ........................ 174/16.1; 454/184; 312/236; 165/185, 80.3, 80.4, 121–126, 104.21, 104.33, 104.34; 361/608, 676–678, 690, 691, 694–696, 698, 701, 724, 727, 730

(56) References Cited

U.S. PATENT DOCUMENTS

| | | | |
|---|---|---|---|
| 4,266,602 A | * | 5/1981 | White et al. ................. 165/124 |
| 4,535,386 A | * | 8/1985 | Frey, Jr. et al. .............. 361/714 |
| 4,706,461 A | | 11/1987 | Pratt et al. ..................... 60/599 |
| 5,467,250 A | | 11/1995 | Howard et al. ............. 361/696 |
| 5,529,120 A | * | 6/1996 | Howard et al. ............. 165/166 |
| 5,801,632 A | * | 9/1998 | Opal ........................... 340/585 |
| 6,039,111 A | | 3/2000 | Kawaguchi et al. ... 165/104.14 |
| 6,086,476 A | * | 7/2000 | Paquin et al. ................ 454/184 |
| 6,123,266 A | | 9/2000 | Bainbridge et al. ........ 236/49.3 |
| 6,164,369 A | | 12/2000 | Stoller .................... 165/104.33 |
| 6,167,947 B1 | | 1/2001 | Hokanson et al. .......... 165/80.3 |

(List continued on next page.)

OTHER PUBLICATIONS

Article entitled "New Thermal Management Solution for High Density Data Processing and Storage", Jun. 2002, by Sanmina–SCI Enclosure Systems.
Chu et al., IBM Technical Disclosure Bulletin, Multi–Functional Interior Cover System for High Performance Electronic Equipment, vol. 23, No. 2, Jul. 1980, pp. 698–699.

*Primary Examiner*—Michael Datskovsky
(74) *Attorney, Agent, or Firm*—Andrew J. Wojnicki, Jr.; William B. Porter

(57) ABSTRACT

An enclosure apparatus provides for combined air and liquid cooling of rack mounted stacked electronic components. A heat exchanger is mounted on the side of the stacked electronics and air flows side to side within the enclosure, impelled by air-moving devices mounted behind the electronics. Auxiliary air-moving devices may be mounted within the enclosure to increase the air flow. In an alternative embodiment, air-to-liquid heat exchangers are provided across the front and back of the enclosure, and a closed air flow loop is created by a converging supply plenum, electronics drawers through which air is directed by air-moving devices, diverging return plenum, and a connecting duct in the bottom. In a variant of this embodiment, connecting ducts are in both top and bottom, and supply and return ducts are doubly convergent and doubly divergent, respectively. Auxiliary blowers may be added to increase total system air flow. The enclosure also may be provided with automatically opening vent panels to allow room air to circulate and cool in the event of an over-temperature condition. The design of the enclosure permits it to be constructed apart from the rack-mounted apparatus and subsequently attached to the rack, if desired, at the facility at which the rack had been previously operating.

19 Claims, 16 Drawing Sheets

U.S. PATENT DOCUMENTS

| | | | |
|---|---|---|---|
| 6,189,608 B1 | 2/2001 | Bodas et al. | 165/300 |
| 6,305,180 B1 | 10/2001 | Miller et al. | 62/259.2 |
| 6,345,512 B1 * | 2/2002 | Cosley et al. | 62/259.2 |
| 6,351,381 B1 | 2/2002 | Bilski et al. | 361/695 |
| 6,366,461 B1 | 4/2002 | Pautsch et al. | 361/690 |
| 6,374,627 B1 | 4/2002 | Schumacher et al. | 62/259.2 |
| 6,506,111 B2 | 1/2003 | Sharp et al. | 454/184 |

\* cited by examiner

METHOD AND APPARATUS FOR COMBINED AIR AND LIQUID COOLING OF STACKED ELECTRONICS COMPONENTS

FIELD OF THE INVENTION

The present invention relates in general to systems and methods for cooling rack-mounted assemblages of individual electronics units, such as rack-mounted computer server units.

BACKGROUND OF THE INVENTION

The power dissipation of integrated circuit chips, and the modules containing the chips, continue to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g. memory, disk drives, power, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e. RPM) of an existing air moving device. However, this approach is becoming unmanageable at the frame level in the context of the computer installation (i.e. data center). The sensible heat load carried by the air exiting the frame will eventually exceed the ability of the room air conditioning to effectively handle the load. This is especially true for large installations with "server farms" or large banks of computer frames close together. In such installations not only will the room air conditioning be challenged, but the situation may also result in recirculation problems with some fraction of the "hot" air exiting one frame being sucked into the air inlets of a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the openings required in the frame for the entry and exit of air flow makes it difficult, if not impossible, to provide effective acoustic treatment to reduce the acoustic noise level outside the frame. Finally, as operating frequencies continue to increase, we are approaching the point where electromagnetic (EMC) cross talk between tightly spaced computer frames is becoming a problem largely due to the presence of the openings in the covers required for air flow.

Recently, there has been an attempt to address some of the defects noted above by combining the air cooling approach with an air-to-water heat exchanger fixed within the server cabinet below the frame electronics. An example of such a system is Sanmina's EcoBay™ 442. The present invention builds upon prior approaches in ways that will become apparent below.

For the foregoing reasons, therefore, there is a need in the art for an improved and self-contained mechanism for cooling rack-mounted modular electronic units. Objects of the present invention include providing such a mechanism, while addressing, for example, the acoustic and EMC constraints noted above.

SUMMARY

The invention described here, which provides an air/liquid heat removal enclosure system with electromagnetic and acoustic noise control capability for electronic equipment, is an improvement over prior art systems. The invention utilizes an enclosure scheme within which a stack or stacks of electronic drawers are packaged. Air is circulated within the enclosure to cool the electronics and is passed across one or more air-to-liquid finned-tube heat exchanger(s) (mounted to the side of the electronics in a first embodiment, and in front and/or back of the electronics in a second embodiment) to transfer the total system heat load to water which then exits the frame. Because the frame is closed and because the inner walls are lined with sound absorbent or deadening material, much of the acoustic noise caused by the air moving devices will be contained within the closed cabinet. Also, since the cabinet is closed with only minimal openings at the bottom of the frame for cables, it will also exhibit improved characteristics with respect to reducing both susceptibility to electromagnetic interference from outside the cabinet and electromagnetic radiation from within the cabinet.

In one embodiment, the apparatus is described with a side-mounted air-to-liquid heat exchanger. In a second embodiment, the heat exchanger is in front of and/or behind the electronics and the air circulation is top to bottom, with a connecting duct in the bottom, a converging air flow supply plenum being formed in the front cover, a diverging air flow return plenum being formed in the back cover, with one or more optional air moving devices being located in the plenums; in a variant of the second embodiment, a connecting duct is in the top, with converging supply and diverging return air flow plenums; in yet another variant, connecting ducts are in both top and bottom and supply and return air flow plenums are doubly convergent and doubly divergent, respectively. Finally, a mechanism is described for automatically opening vent panels in the event of loss of coolant so that room air can be used for temporary cooling.

The recitation herein of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 13b is a view from above the door mechanisms of FIG. 13a;

DETAILED DESCRIPTION OF THE INVENTION

Figure 1:
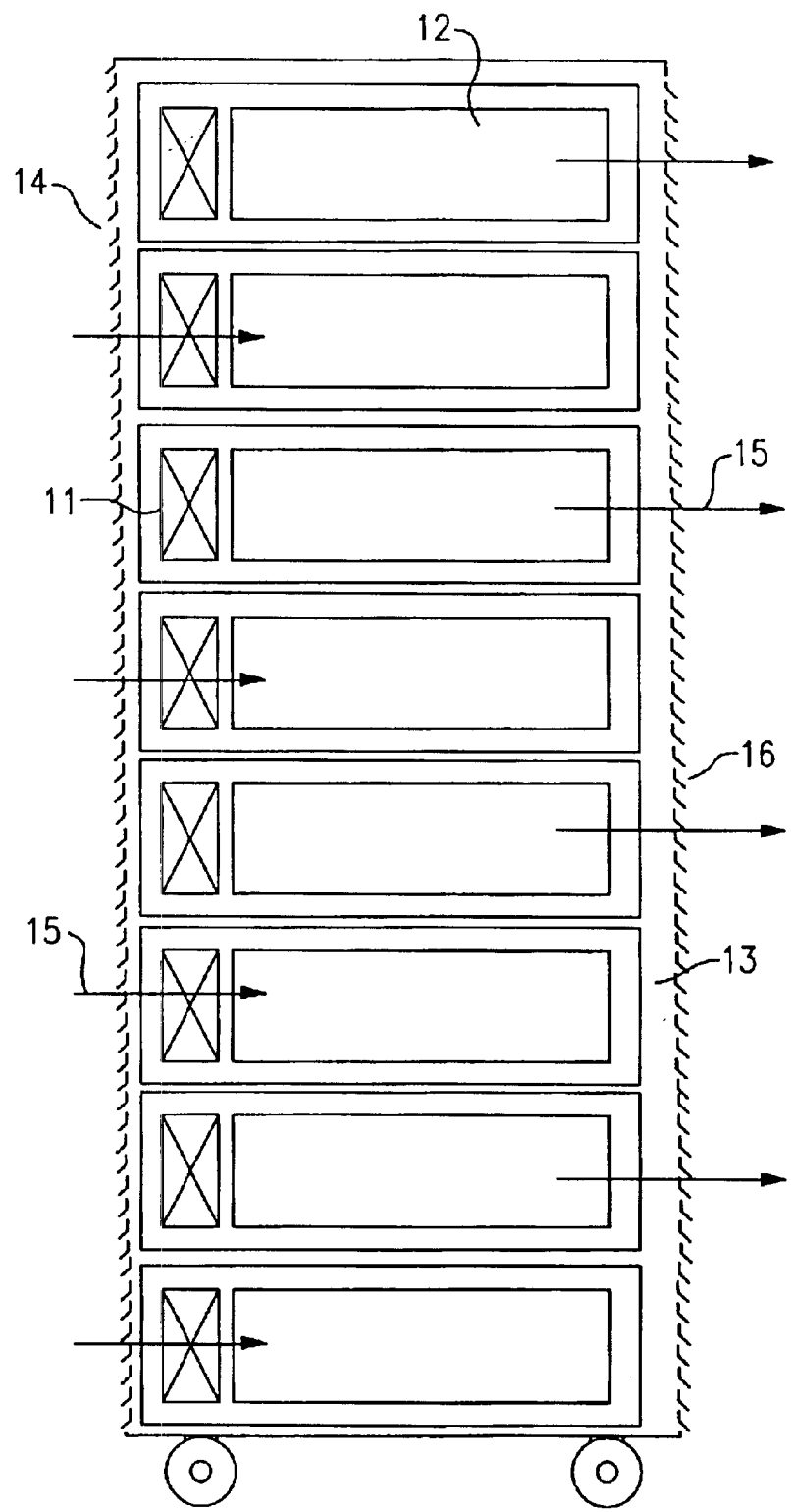
FIG. 1 is a conventional air-cooled frame with electronics in removable drawers.

As shown in FIG. 1, in rack-mounted configurations typical in the prior art, a plurality of air moving devices (e.g. fan or blower 11) provides the forced air flow 15 needed to cool the electronic components 12 within the drawer 13. Cool air is taken in through the louvered covers 14 in the front of the frame and exhausted out of the louvered covers 16 in the back of the frame.

A first embodiment of the present invention uses the principle of closed air circulation heat removal and introduces an air flow configuration coupled with the placement of the heat exchanger on the side of the electronics frame; it may be preferred in that it offers the following advantages:

The side-mounted heat exchanger is not readily susceptible to accidental damage due to water leakage when service is performed.

The height of the frame is not extended. This is important in a room with sprinkler heads less than nine feet from the floor as there is a safety specification requiring a minimum of 18 inches from the top of the frame to the sprinkler head.

Side chilled air sub-frame is shipped separately and on its own casters greatly simplifying assembly in the field.

Condensation that may be produced by the air chilling heat exchanger is well away from the electronics.

The positioning of the heat exchanger allows for large dimensions with an associatedly large heat removal capability.

Figure 2:
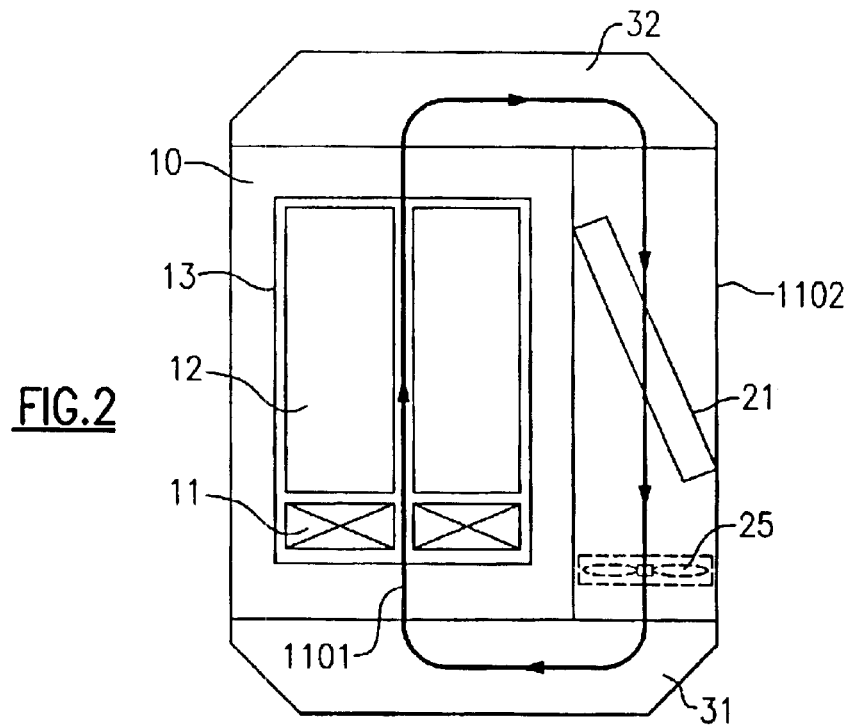
FIG. 2 is a cross sectional top view of a horizontal closed loop air flow heat removal system for electronics frame with side mounted cooling frame (water connections to the heat exchanger not shown)

FIG. 2 shows a cross-sectional top view of the embodiment under discussion. In this embodiment, the path for the closed loop air flow 1101 is horizontal in nature in that it passes from side to side. Specifically, air chilled by the heat exchanger 21 located in the side mounted chilled air sub-frame 1102 is directed to the front of the electronics frame 10 within the front cover 31. Heat dissipated by the electronics 12 is transferred to the air as it passes through the electronics frame. The air is redirected into the side mounted chilled air sub-frame 1102 by the back cover 32 thus completing the closed loop air flow. Air moving devices 25 may be added within the side-mounted chilled air sub-frame 1102 if required to handle the additional pressure drop associated with the closed loop flow. Note that the heat exchanger 21 is positioned diagonally across the width of the sub-frame. This configuration assures the best heat transfer while minimizing air side pressure drop for a sub-frame of a given width. It is important to minimize the width of the sub-frame because it increases the total footprint of the electronics frame.

Figure 3:
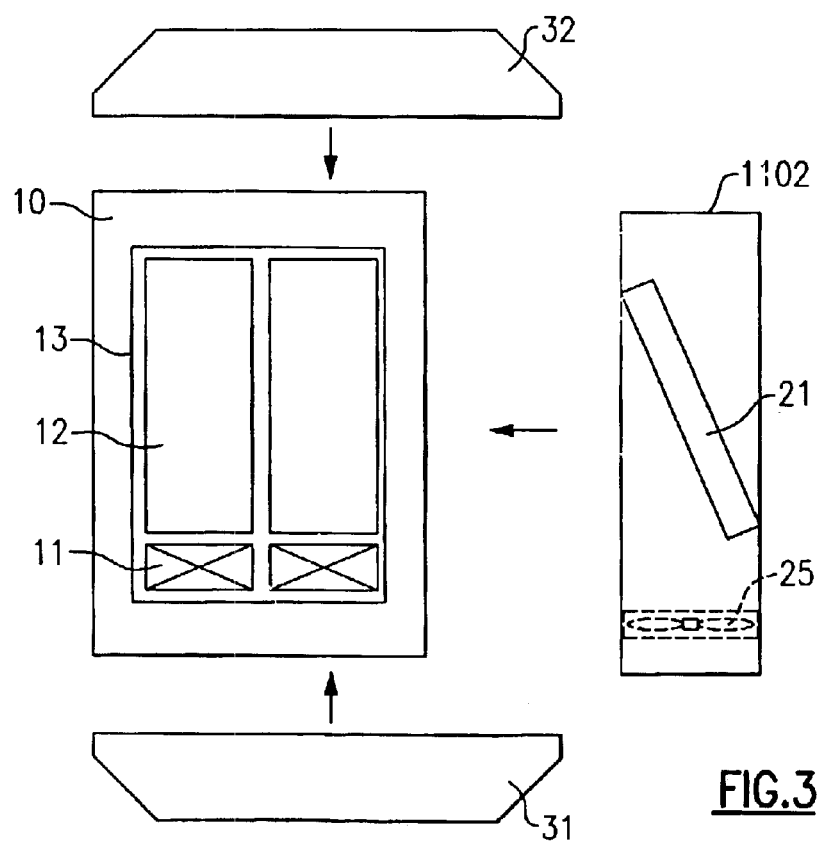
FIG. 3 is an exploded view of FIG. 2.

To emphasize the nature of the side-mounted chilled air sub-frame, an exploded top view of the frame assembly is shown in FIG. 3. Note that both the back 32 and front covers 31, as well as the chilled air sub-frame 1102, may be shipped separately and assembled to the electronics frame in the field.

Figure 4A:
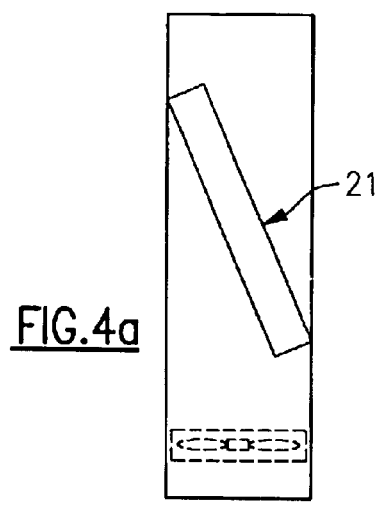
FIGS. 4a, 4b, and 4c are more detailed views of the side mounting chilled air sub-frame;.
Figure 4B:
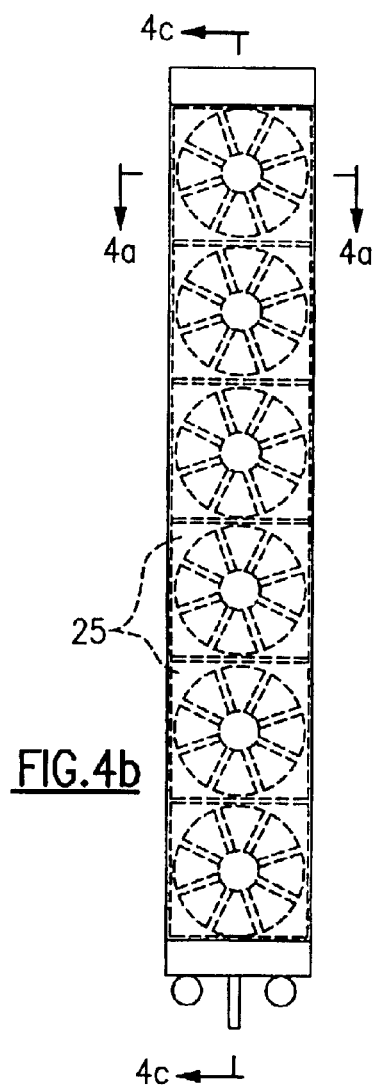
Figure 4C:
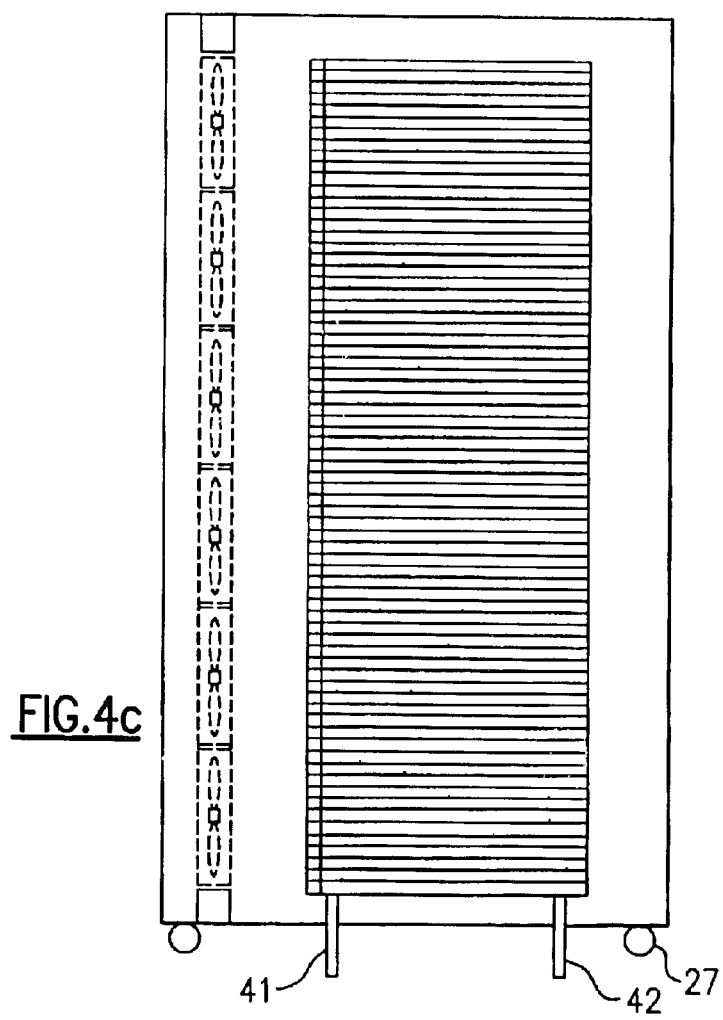

And finally, FIGS. 4a, 4b, and 4c further illustrate the chilled air sub-frame illustrating that it is a separate frame with its own casters for easily moving into position along side the electronics frame.

Figure 5A:
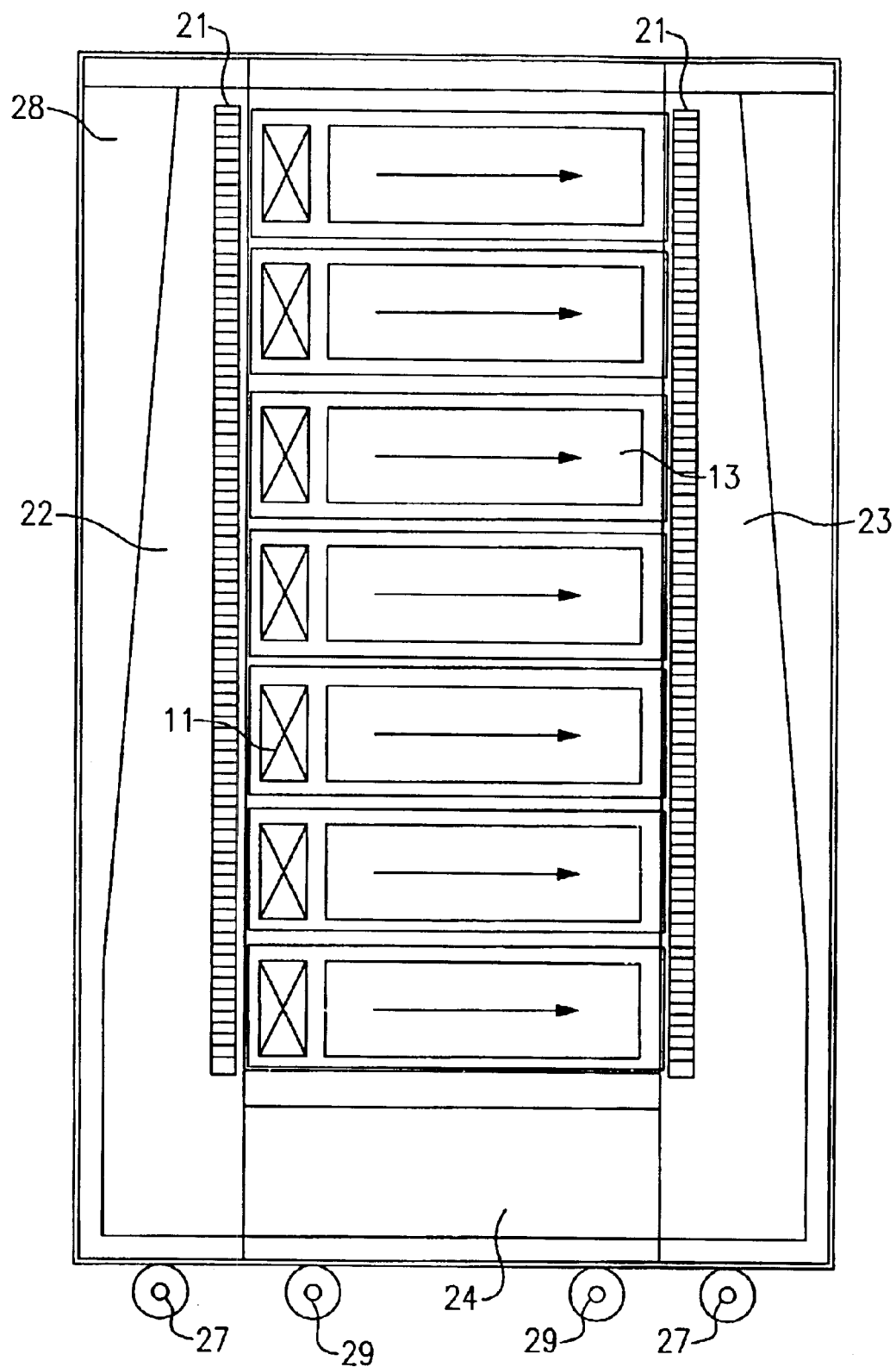
FIG. 5a is a cross-section side view of a cabinet and stack of electronics drawers in a second embodiment of the present invention.
Figure 5B:
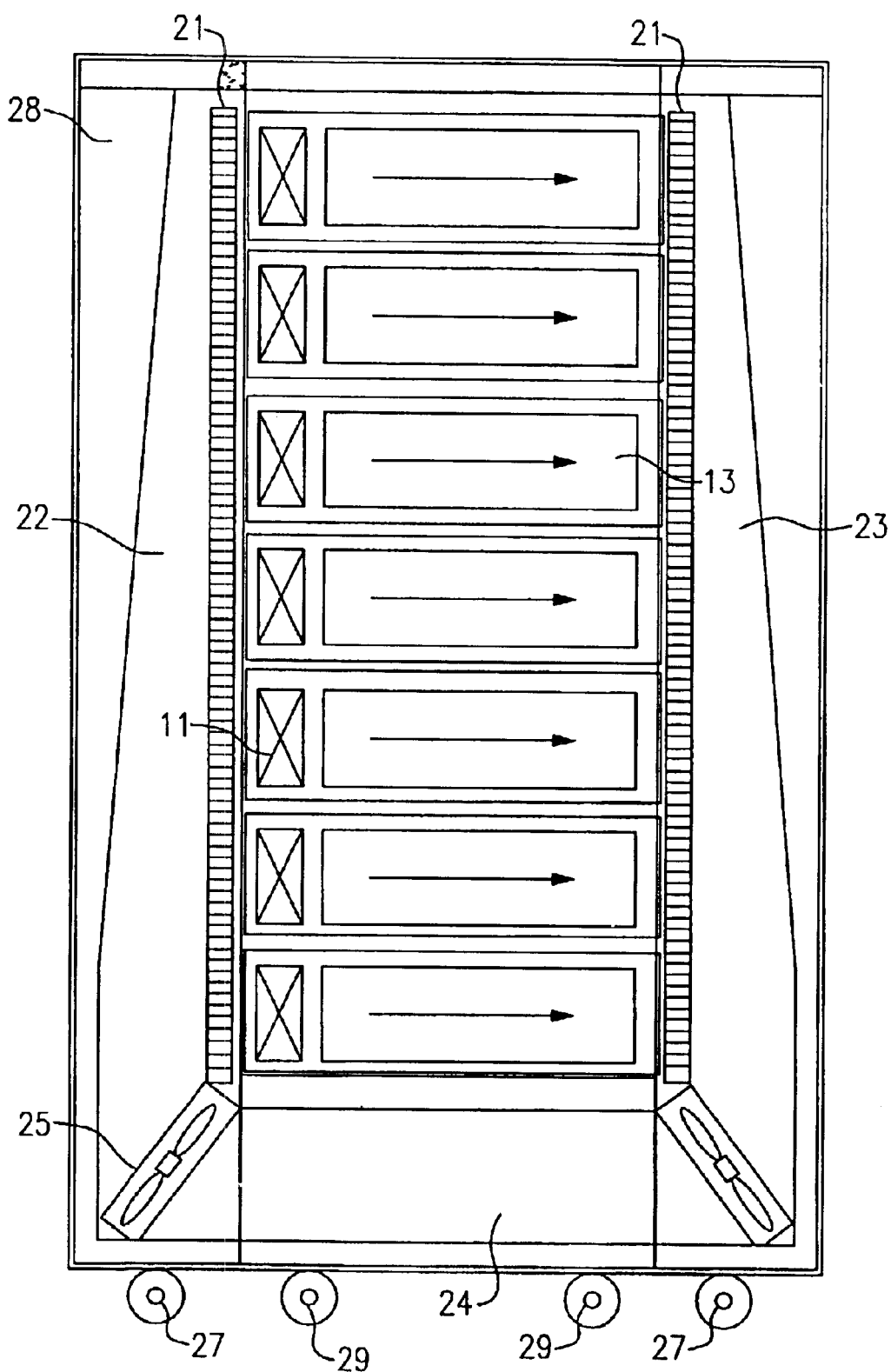
FIG. 5b is a cross-section side view of a cabinet and stack of electronics drawers in a variant of the second embodiment of the present invention.

In accordance with a second embodiment of the present invention, a cross-sectional side view of the cabinet and stack of electronic drawers is shown in FIGS. 5a and 5b. As shown in FIG. 5a, air-to-liquid heat exchangers 21 to remove heat from the closed loop air cooling stream are provided across the front (entrance) and/or back (exit) of the stack of electronics drawers. A closed air flow loop is created by the supply plenum 22, electronics drawers 13, return plenum 23, and the connecting duct 24 at the bottom of the cabinet. Although not shown, electrical cables may penetrate the connecting duct to provide signal I/O and electrical power from outside the cabinet. As shown in FIG. 5b, auxiliary fans or blowers 25 may be provided at the inlet and exit of the supply and return air plenums, respectively, to increase the total system air flow and overcome any additional pressure drops incurred due to flow through the plenums. It will be noted that a converging cross-section profile is utilized in the supply plenum 22 and a diverging cross-section profile is used in the return plenum 23. The converging and diverging profiles are formed by the addition of surrounding filler material 28, which may preferably be a sound absorbing material such as polyurethane SONEX classic available from Silent Source Interior Acoustical Products of Northampton, Mass. (This example is representative of a class of products serving similar functions and does not imply any particular requirement for the specific characteristic of this product.) This is done to make the flow through each drawer as nearly uniform as possible. It should also be noted that the plenums and heat exchangers in the left side and right side of the cabinet are part of and are incorporated within the covers (or doors) which may be opened to access the electronics drawers. It may be seen that casters are provided both beneath 29 the central portion of the frame containing the stack of electronics cabinets, and under 27 the front and rear doors 27 to support their weight as they are moved into the open position. In order to minimize or even eliminate electromagnetic interference with other electronic equipment in the computer space the cabinet's outer walls are to be made of a continuous sheet of metal (e.g sheet metal ) or a composite/laminate structure containing a continuous sheet of metal. The metal sheet is to cover nearly all if not all the surface area associated with the cabinet walls. Additionally, the sheet metal is to be electrically grounded. In addition, electrically conductive gasket or tape should be used when the enclosure cabinet is attached onto the electronics frame to reduce EMC leaks through the interface. This has been a standard process to install EMC-related covers for computing equipment.

Figure 6:
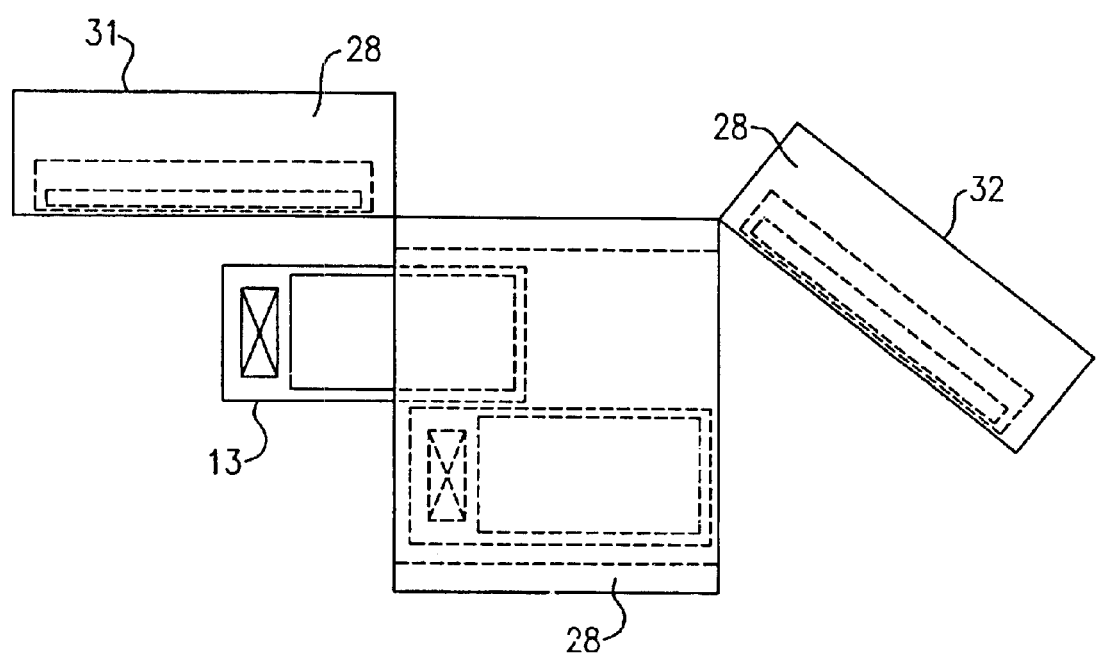
FIG. 6 is a top view of a cabinet with front and back covers open.

FIG. 6 provides a top view of the cabinet with the front door 31 swung fully open and the rear door 32 partially open to demonstrate how maintenance would be performed on the computer system. An electronics drawer 13 is also shown partially open extending outward from the stack of electronics drawers. Note that under this condition the electronics in the unaffected drawers can continue to operate because nothing has been done to interrupt the air flow through said drawers. Temperatures may increase somewhat and the heat load to the room will also increase a bit, but since this condition will occur for a relatively short time period (30 minutes or less), there should be no perceivable impact to computer performance or reliability.

Figure 7:
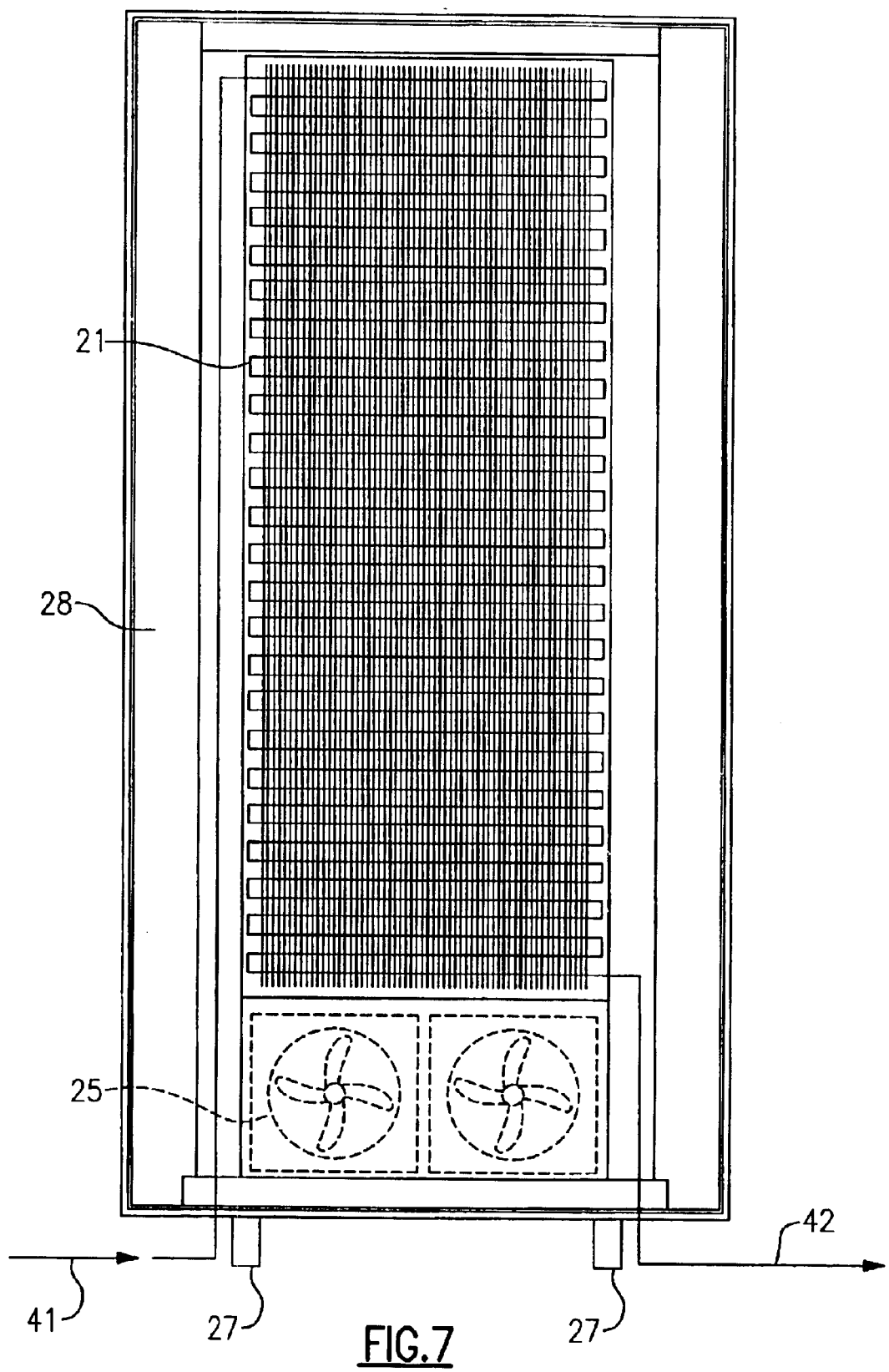
FIG. 7 is a rear cross-section view showing a monolithic air-to-liquid heat exchanger.
Figure 8A:
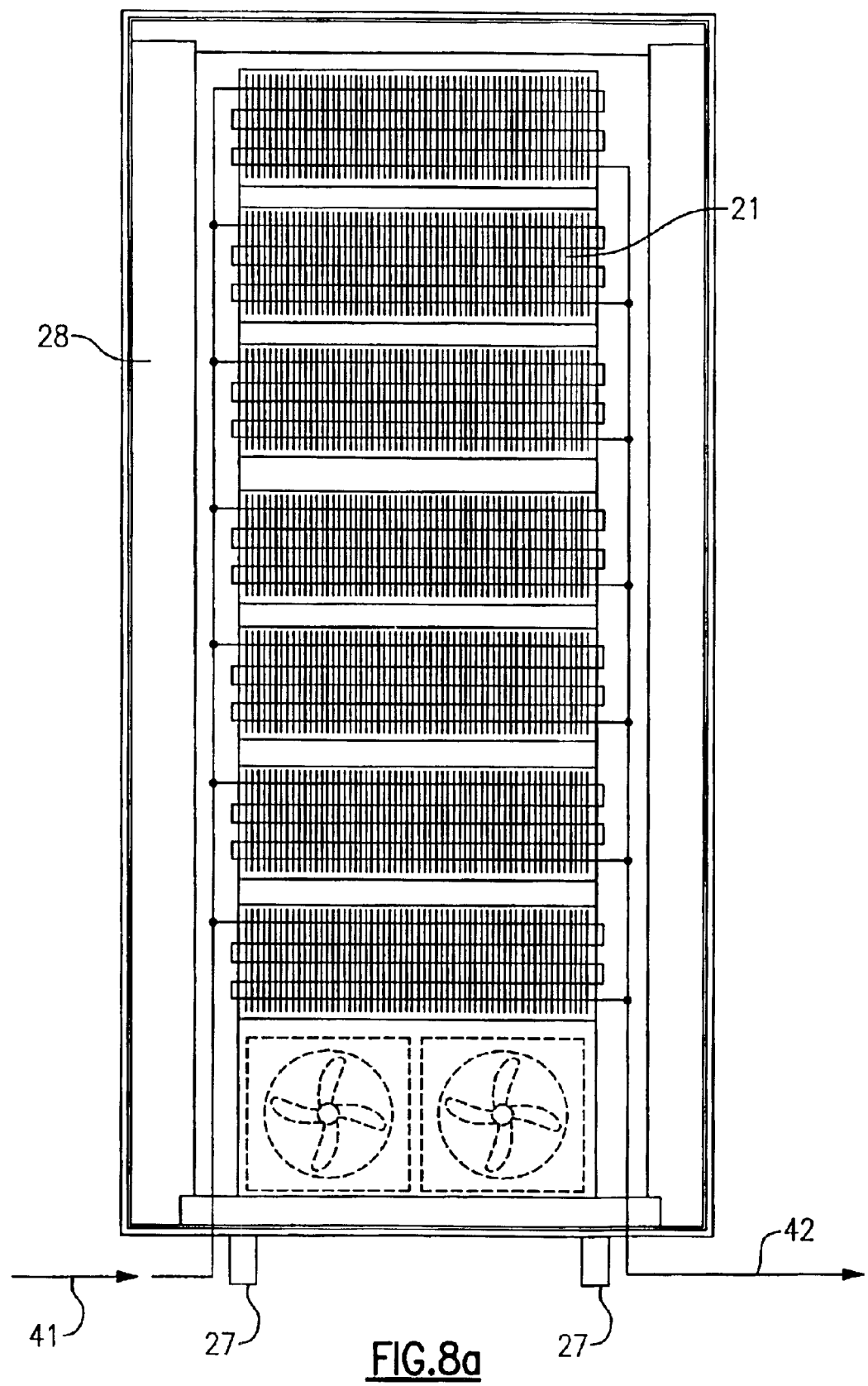
FIG. 8a is a front cross-section view showing a bank of individual air-to-liquid heat exchangers.
Figure 8B:
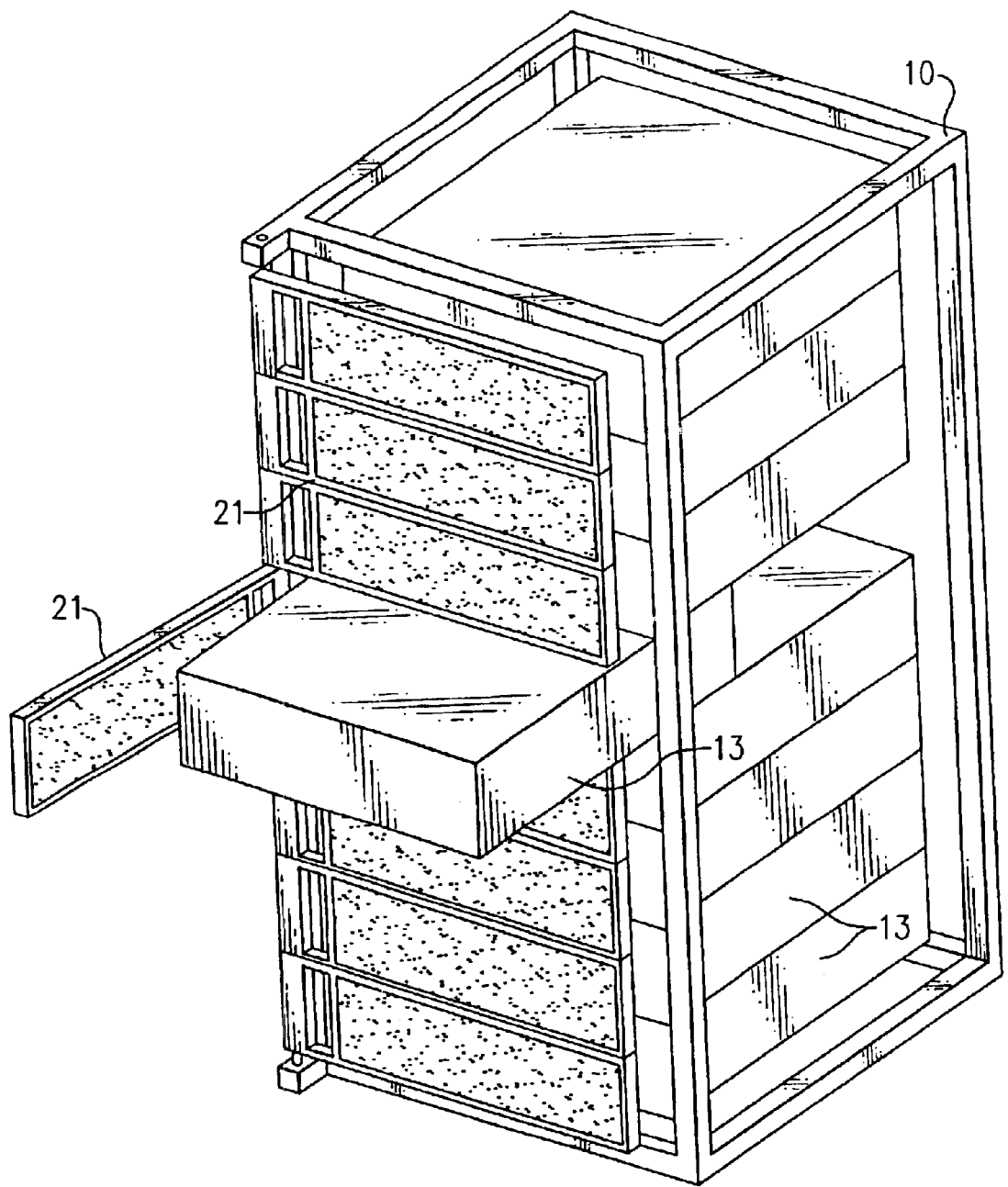
FIG. 8b is an isometric view where the bank of individual air-to-liquid heat exchangers are each individually hinged.

FIG. 7 shows a front cross-sectional view of the cabinet in a second embodiment. A liquid coolant (e.g., water) enters 41 and leaves 42 the cabinet through openings in the bottom. FIG. 7 shows a single monolithic air-to-liquid heat exchanger 21 covering the entire stack of electronics drawers. Alternatively, FIG. 8a shows a front cross-sectional view where a bank of individual air-to-liquid heat exchangers 21 are coupled to cover the stack of electronics drawers. FIG. 8b shows the hinging of the individual exchangers with one of them swung out so that a drawer 13 can be opened. This is done so that when a particular electronics drawer has to be pulled or removed from the electronics frame only the heat exchanger associated with the corresponding electronics drawer has to be repositioned. In both FIGS. 7 and 8a, air moving devices 25 are shown at the bottom of the air flow duct spanning the width of the duct. Additionally, sound absorbing material 28 can be seen lining both side walls and the top and bottom of the cabinet.

Figure 9:
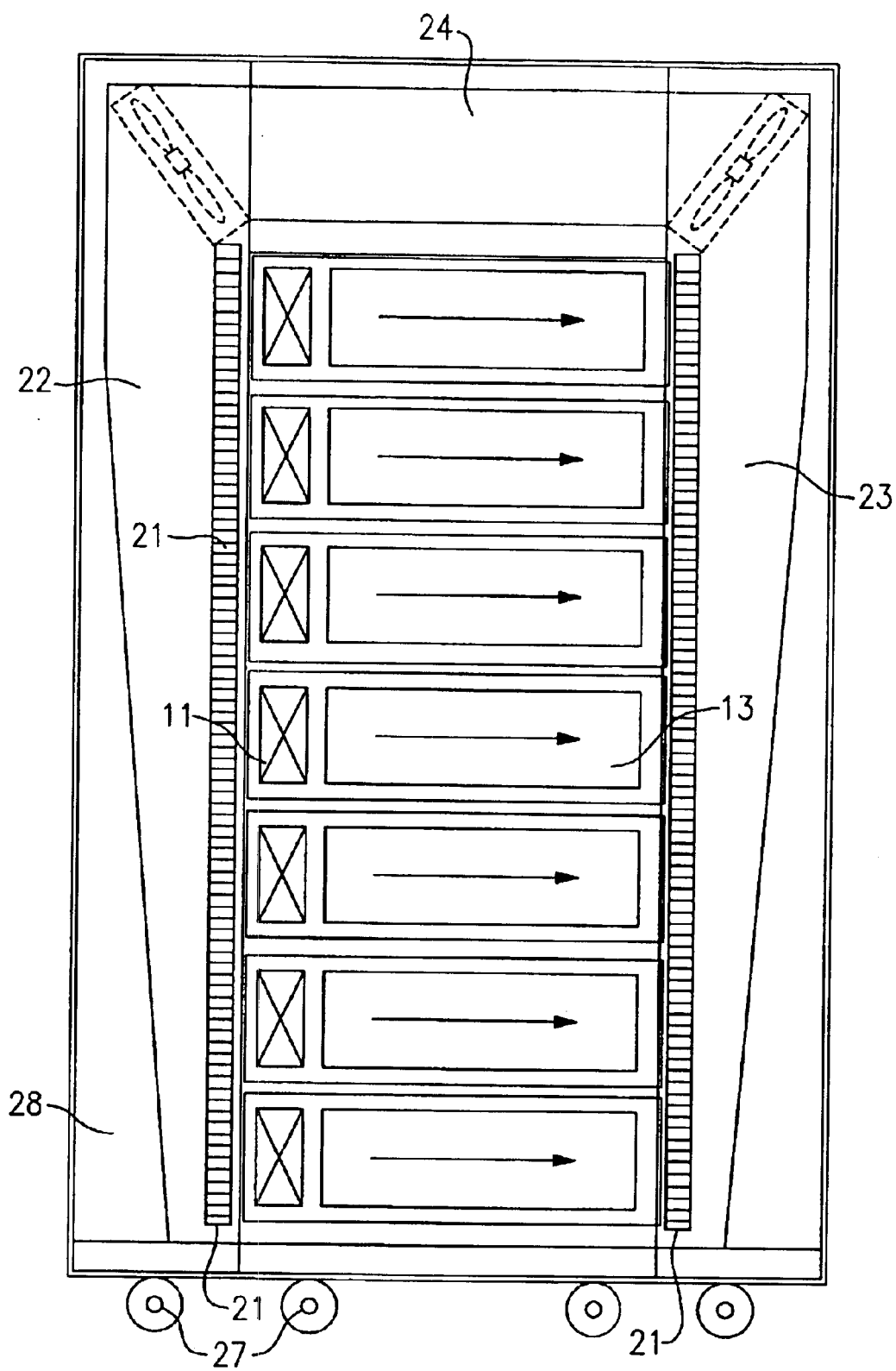
FIG. 9 is a cabinet configuration with a duct placed on top of the cabinet for air flow from a return duct to a supply duct.
Figure 10:
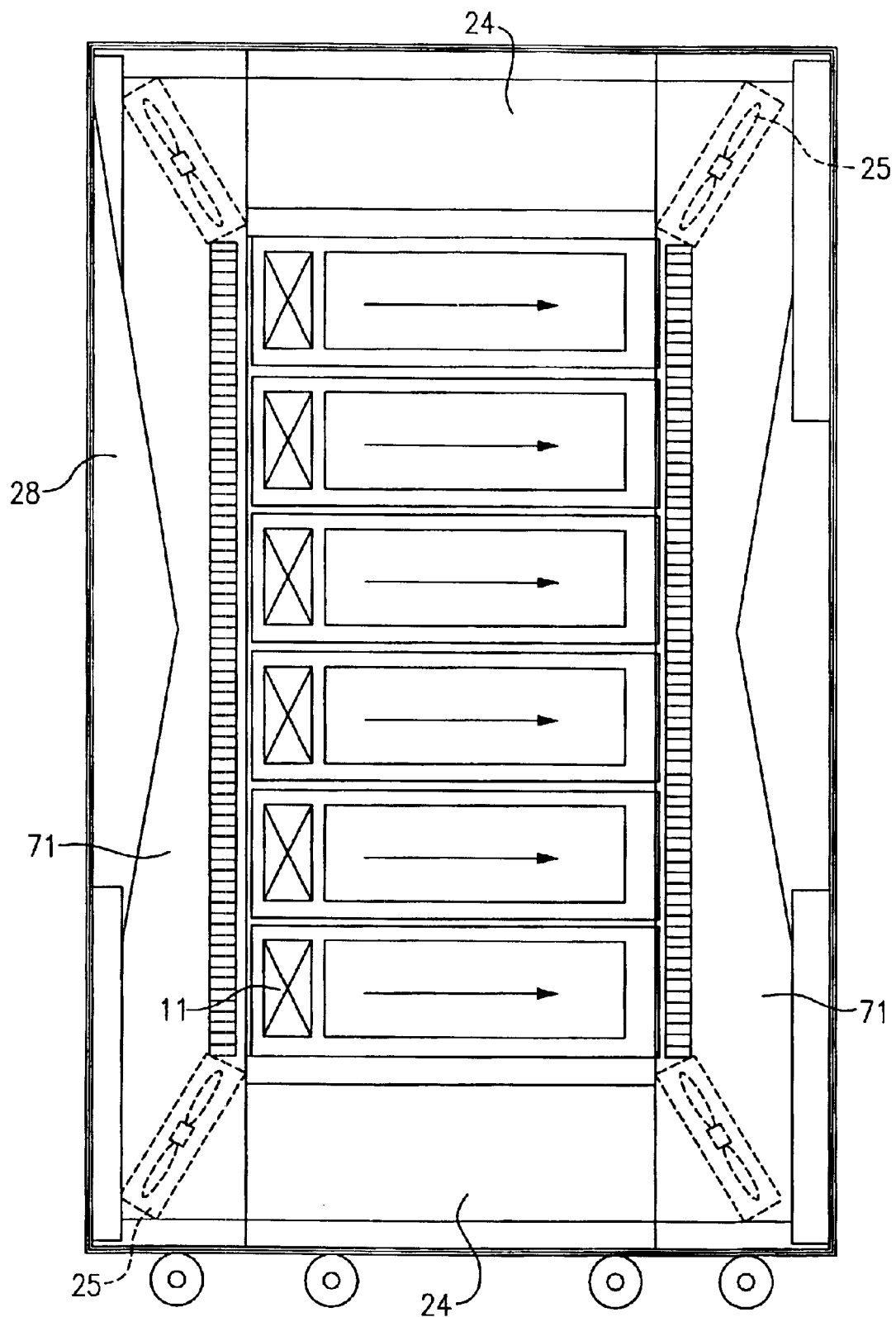
FIG. 10 is a cabinet configuration with ducts placed at both top and bottom of the cabinet for air flow from a return duct to a supply duct.

FIGS. 9 and 10 show variants of the second embodiments of the invention. FIG. 9 shows a cabinet configuration with the connecting path or duct 24 for air flow from the return duct to supply duct placed at the top of the cabinet. FIG. 10 shows a cabinet with air flow connecting ducts 24 at both top and bottom of the cabinet. In this configuration essentially one-half of the total flow occurs through the top half of the cabinet and the other one-half through the bottom of the cabinet. Although the ducts will occupy more cabinet space, this configuration will provide the most uniform distribution of air flow across the stack of electronics drawers. It may be noted that in this latter configuration, the cross-section profile of the supply and return plenums are doubly convergent and doubly divergent respectively 71. It may be readily appreciated that the cabinet can be constructed as integral to the frame comprising the stack of electronics components or can be constructed integrally with the surrounding cabinet. Alternatively, the surrounding cabinet can be constructed separately and later attached to the frame.

It can be appreciated that while the doors are open, the electronics in unaffected drawers can continue to operate by taking in room air for cooling and exhausting the heated air to the room. However, no consideration has yet been given as to what action is necessary to provide continued cooling in the event of an interruption of the flow of cooling water to the heat exchangers in the closed frame. In this instance air would continue to circulate in the closed frame picking up heat from the electronics until the air temperature entering the electronics drawers becomes so high as to necessitate a shutdown of power. Of course, this course of action is highly unacceptable from the customer viewpoint as it directly impacts the conduct of business whatever it may be.

Figure 11A:
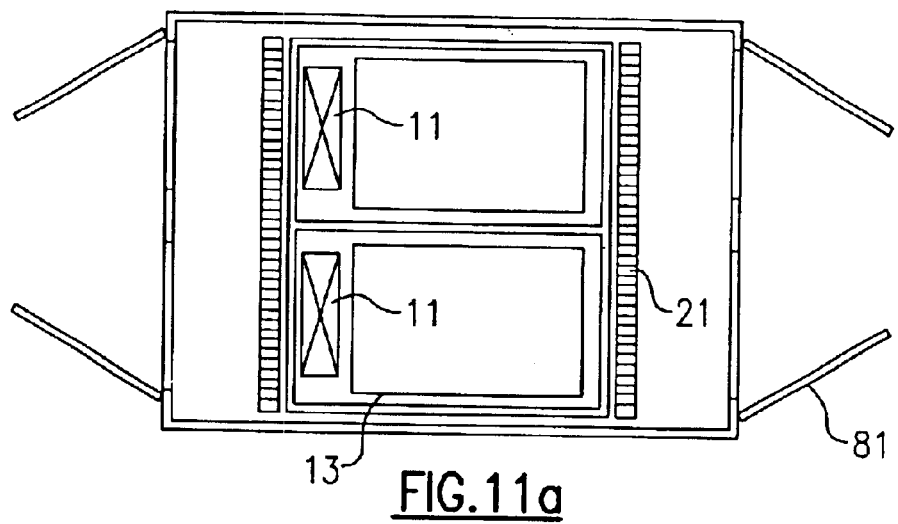
FIG. 11a is a top cross-section view of a closed-loop air/liquid heat removal enclosure system with vent panels open for the second embodiment.
Figure 11B:
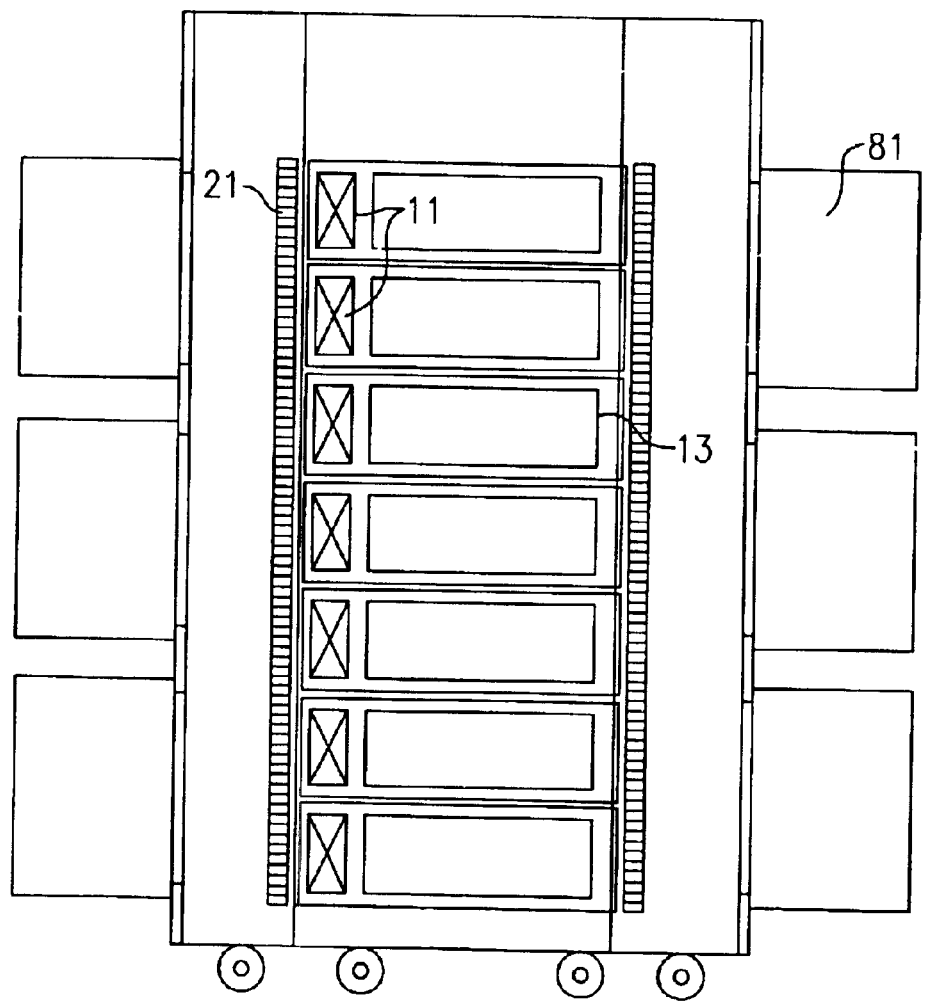
FIG. 11b is a side cross-section view of a closed-loop air/liquid heat removal enclosure system with vent panels open for the second embodiment.

The refinement described below provides a mechanism for automatically opening vent panels in the covers to allow room air to pass through the electronic drawers in the event of a loss of water-cooling and still allow the computer to continue to operate without an excessive temperature build-up. FIGS. 11a and 11b show an approach to this refinement tailored to the second embodiment of the present invention which approach is likewise usable in the first embodiment. FIG. 14 shows an approach tailored to the first embodiment of the present invention. As can be readily appreciated, this approach is also usable in the second embodiment. Both approaches avoid swinging the entire door open, so reducing intrusion into the aisle space.

FIG. 11a shows the top and FIG. 11b shows the side cross-section views of a closed-loop air liquid heat removal enclosure system with the vent panels in the doors open at each end of the computer frame. This is the configuration that would exist immediately following system detection of an air circulation flow over-temperature due to the loss of water-cooling in terms of either unacceptably low water flow rates or excessive cooling water temperatures or a loss of the auxiliary fans or blowers. The vent panels 81 have automatically swung outward allowing room air to pass through cutouts in the left and right hand doors. Air is sucked through each electronics drawer by the fan or blower 11 residing within the drawer, thereby providing cooling to the electronic components within the drawer. The hot exhaust air is blown out into the room.

Figure 12A:
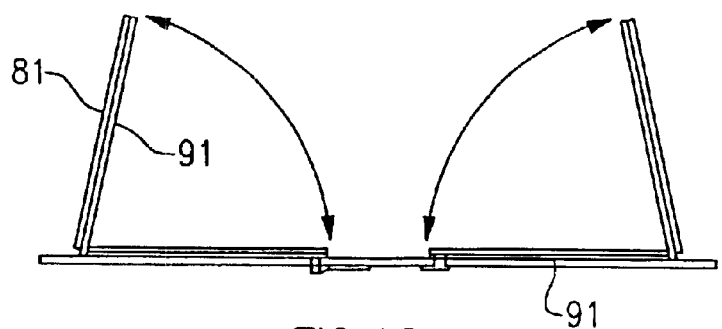
FIG. 12a is a top view of a door with multiple automatically opening vent covers.
Figure 12B:
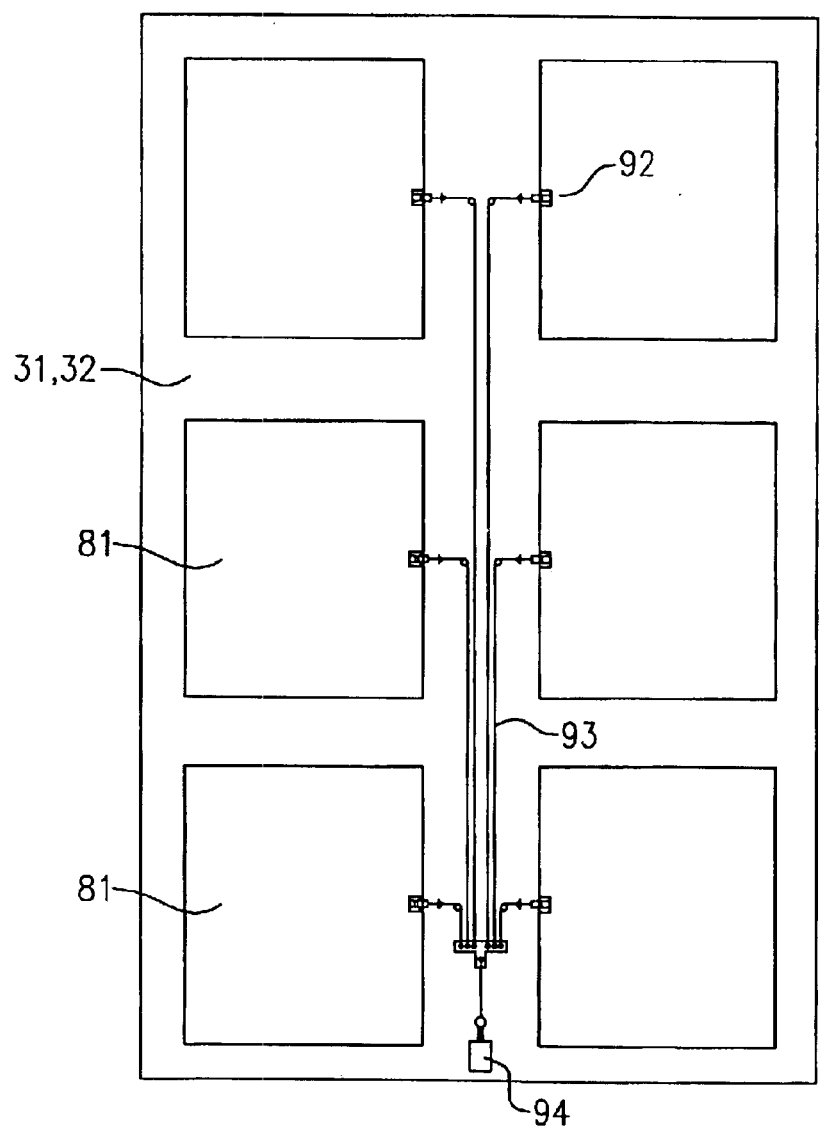
FIG. 12b is a view from the inside of a frame, looking outward, of a door with multiple automatically opening vent covers.

Under normal operating conditions, the vent panels are closed flush against the doors allowing air to circulate within the system enclosure. FIG. 12a shows a top view, and FIG. 12b shows a front view (looking from within the system enclosure) of a door with the vent panels. A soft rubber gasket seal 91 is provided around the perimeter of the cover panel on the side facing the door. When the panel is closed, the seal is of a sufficient quality to prevent ingress or egress of air through the cutouts in the door. Either a greater or lesser number of vent covers 81 and cutouts in the door than those shown may be employed. The front view shows the position of door latches 92 to keep the vent cover shut under normal operating conditions and the actuation cables 93 and solenoid 94 employed to open the latch mechanism(s) in the event of a circulating air flow over temperature condition.

Figure 13B:
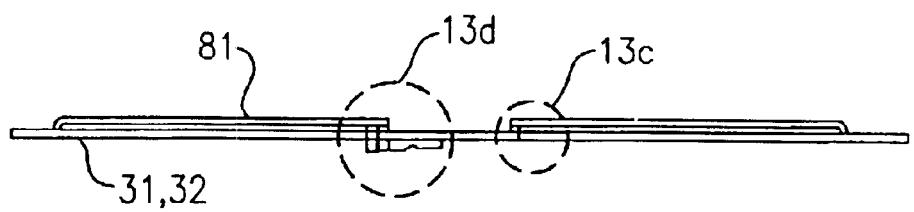
Figure 13A:
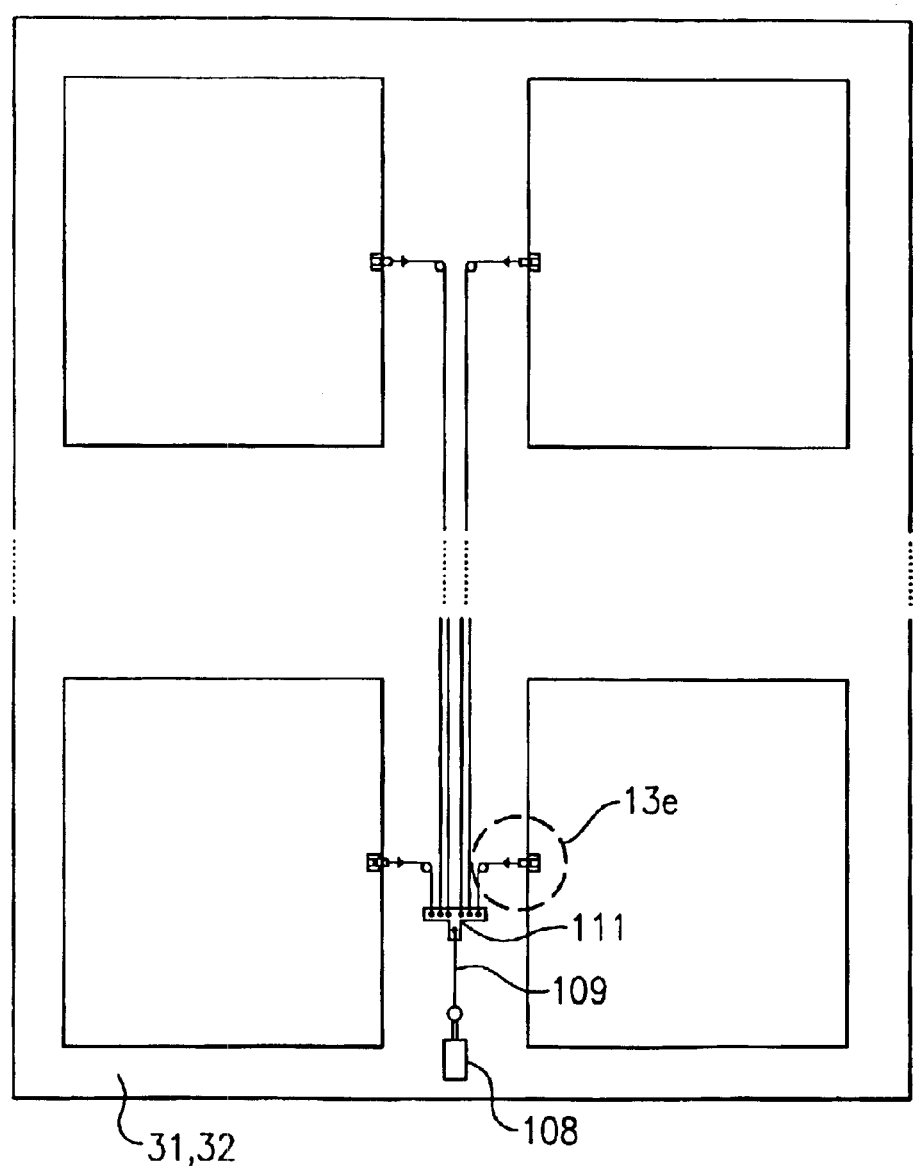
FIG. 13a is a detailed view of mechanisms for locking and opening door vent covers from inside a frame, looking outward.
Figure 13C:
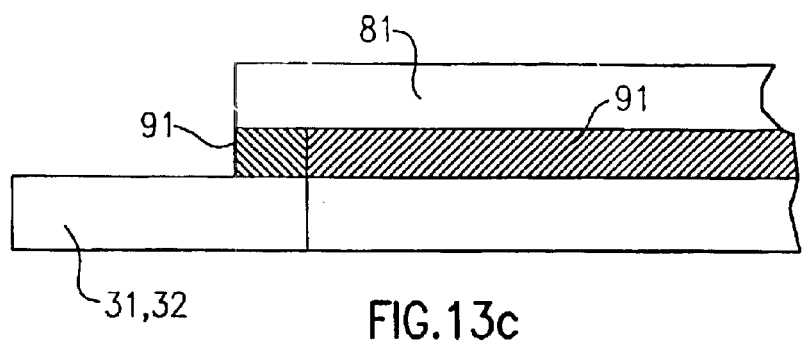
FIG. 13c is an enlarged cross-section of the gasket seal between the vent covers and door surface.

The mechanisms for locking and opening the vent panels are shown in more detail in FIGS. 13a, 13b, 13c, 13d, and 13e. The top view 13b shows the door with vent covers 81 closed as they would be in normal operation. The enlarged view of FIG. 13c depicts the gasket seal 91 provided around the inside edge of each vent cover between the vent cover and door surfaces. When the vent covers are closed, a torsional spring (not shown) located co-axially with the vent cover hinge line is compressed. An outward force exerted onto the vent covers by the torsional spring will open the vent covers when a latch is released. The torsional spring will also keep the doors on the inlet air side from closing due to drafting.

Figure 13D:
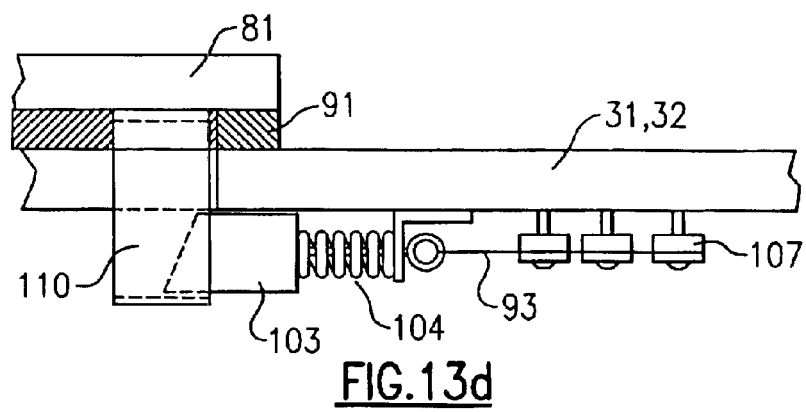
FIG. 13d is a top cross-section view of the vent cover latch assembly.
Figure 13E:
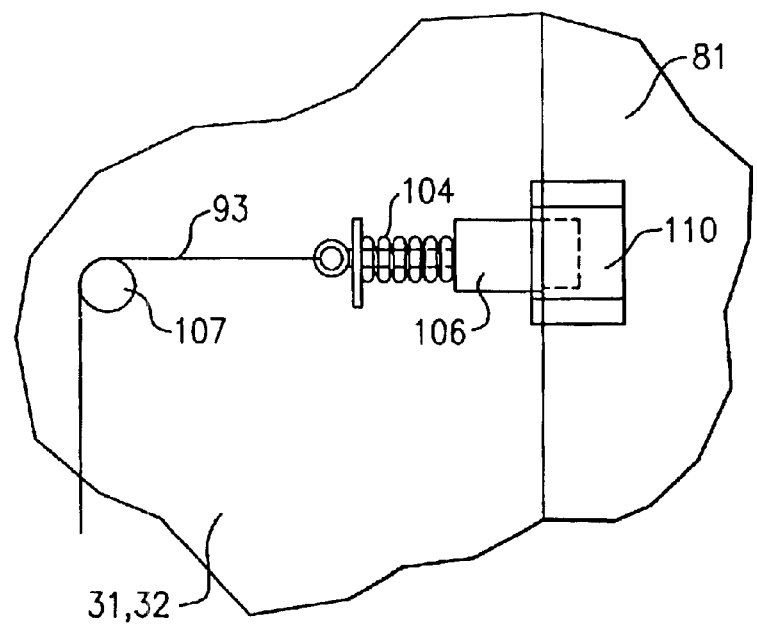
FIG. 13e is an enlarged front view of the latch plunger engaged in the cover latch.

FIG. 13d also shows a top cross-section view of the vent cover latch assembly. When the vent cover is closed, the latch plunger 103 is moved back against the spring 104 and then springs back into place in the cover latch 110 locking the vent cover closed. This arrangement makes it possible for a service technician to close each vent cover individually after correcting whatever condition caused the loss of water cooling incident. FIG. 13e shows an enlarged front view of the latch plunger 103 engaged in the cover latch 110. A small diameter actuation cable 93 is attached to a rod projecting from the end of each plunger. The cable from each plunger goes over a plastic roller wheel 107 down to a common bar (111, FIG. 13a) near the bottom of the door. A single main cable 109 from the common bar connects to a solenoid 108 located closer to the bottom of the door. In the event a circulating air flow over-temperature is detected, the solenoid is electrically actuated pulling down on the main cable and the common bar. Each individual cable moves downward by the same amount causing each latch plunger to withdraw from its vent cover latch. The vent covers are thereby allowed to spring open causing the system enclosure flow configuration to switch from the normal recirculating closed flow pattern to the emergency open flow-through mode. The cooling provided by the heat exchanger could fail in several ways. The chilled water supplied to the heat exchanger could fail. The heat exchanger supply line could plug due to excessive fouling. Finally, the hoses on the supply lines to the heat exchanger or the tubes within the heat exchanger could break resulting in loss of coolant. The action necessary to continue operation of the machine should any of these events occur is to open the covers such that room air could then supply the necessary air flow to cool the nodes. The loss of cooling provided by the heat exchanger would be sensed from a temperature sensor within each node and when multiple (two or more) of these sensors reach their limit, a command would be sent to the door opening mechanism to open the door. Alternatively, a temperature sensor located upstream from the air inlet to the nodes could be used. In addition, leak sensors are installed in a pan installed beneath the heat exchanger, and if water is detected, the solenoid operated valves on the supply and return lines will be closed.

Figure 14A:
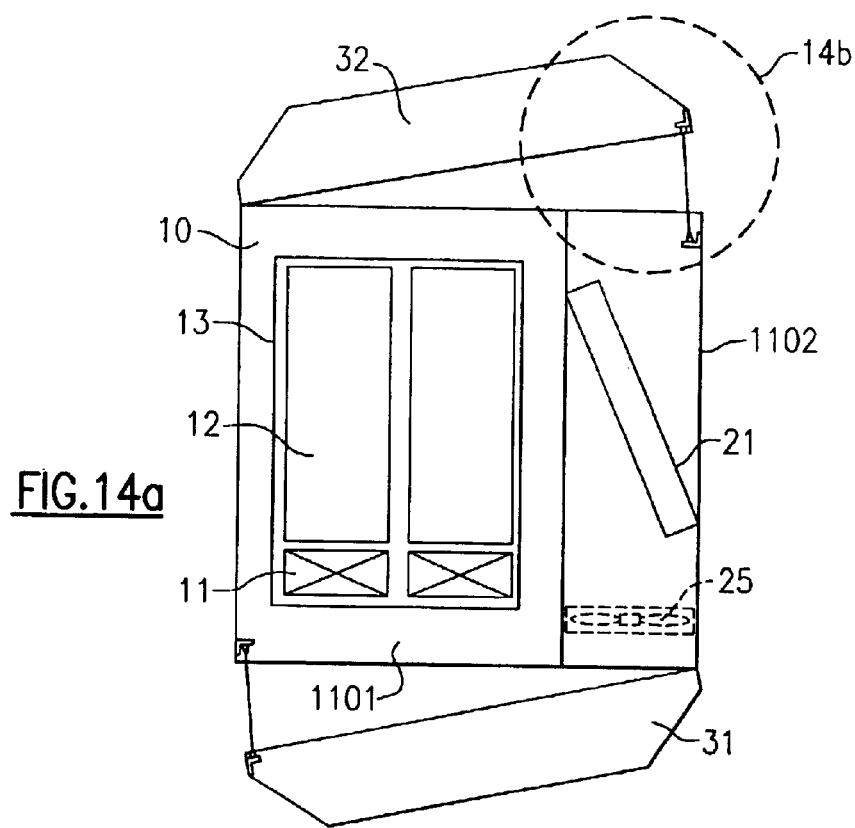
FIG. 14a is a cross-sectional top view of the first embodiment with an approach to handling the over-temperature condition tailored to the first embodiment.
Figure 14B:
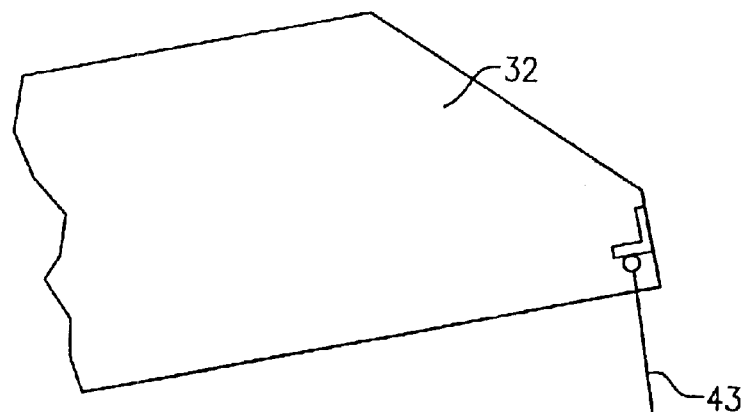
FIG. 14b is an enlargement of the retaining member.

FIGS. 14a and 14b illustrate the system described in the first embodiment above with the front and rear doors open. This is the configuration that would exist immediately following system detection of an air circulation flow over-temperature due to the loss of water-cooling in terms of either unacceptably low water flow rates or excessive cooling water temperatures or a loss of the auxiliary fans or blowers. As was described for FIG. 13, two solenoid actuated latches would have been activated to allow the vent panels to swing open. In FIG. 14a, the doors 31 and 32 have automatically swung outward allowing room air to pass through the rack(s). A retaining member 43 (chain, flexible rod, or the like) prevents the door from opening completely and blocking an aisle—as shown more particularly in FIG. 14b. Air is sucked through each electronics drawer by the fan blower 11 residing within the drawer, thereby providing cooling to the electronic components within the drawer. The hot exhaust air is blown out into the room. Note that the front and rear doors 31 and 32 are preferably hinged on opposite sides as shown in FIG. 14a. Because of this, hot air exhausted out of door 32 will not have a tendency to be sucked into door 31 and back into the system.

Finally, it can readily be appreciated that the configuration described as the first embodiment is particularly well suited to a "field-upgrade" of an existing rack-mounted electronics system to an enclosed system with an air-to-liquid heat exchanger augmenting the pre-existing air-cooling system simply by constructing the sides, cover, and top remotely, then attaching them to the pre-existing unit, in place, and connecting a coolant supply.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A combined air/liquid apparatus for cooling rack-mounted electronic equipment, comprising:

a) a rack unit comprising a plurality of removable drawer units each containing an electronic unit, each removable unit having an air-moving device for directing air through the drawer unit;

b) a cabinet completely encasing the rack unit, the cabinet comprising two sides, a bottom, a front cover coupled to one of the sides so that it can be swung open to reveal the front of the drawer units, and a back cover coupled to one of the sides so that it can be swung open to reveal the back of the drawer units; and c) an air-to-liquid heat exchanger mounted within the cabinet on one side of the removable drawer units at an oblique angle to the removable drawer units, whereby a closed air flow loop is created by the drawer units, back cover, side of the removable drawer units having the air-to-liquid heat exchanger mounted therein, and front cover.

2. The apparatus of claim 1 further comprising an auxiliary air moving device mounted in the side of the removable drawer units having the air-to-liquid heat exchanger mounted therein.

3. The apparatus of claim 2 in which the front cover comprises a plurality of vent panels and an automatic latch mechanism having an over-temperature condition trigger.

4. The apparatus of claim 2 in which the back cover comprises a plurality of vent panels and an automatic latch mechanism having an over-temperature condition trigger.

5. The apparatus of claim 1 in which the cabinet further comprises sound-absorbing filler material.

6. The apparatus of claim 1 in which the front and back covers are hinged on opposite sides and which covers are allowed to open by an automatic latch mechanism having an over-temperature condition trigger.

7. A combined air/liquid enclosed apparatus for cooling rack-mounted electronic equipment, comprising:

a) a rack unit comprising a plurality of removable drawer units each containing an electronic unit, each removable drawer unit having an air-moving device for directing air through the drawer unit;

b) a cabinet completely encasing the rack unit, the cabinet comprising two sides, a bottom, a front cover coupled to one of the sides so that it can be swung open to reveal the front of the drawer units, and a back cover coupled to one of the sides so that it can be swung open to reveal the back of the drawer units, the two covers and the bottom being constructed to form a supply air flow plenum in the front cover, a return air flow plenum in the back cover, and a connecting duct, whereby a closed air flow loop is created by the supply plenum, drawer units, return plenum and connecting duct; and c) an air-to-liquid heat exchanger mounted within the cabinet.

8. The apparatus of claim 7 in which the air-to-liquid heat exchanger is mounted within the front cover.

9. The apparatus of claim 8 in which the air-to-liquid heat exchanger comprises a plurality of individually hinged elements.

10. The apparatus of claim 7 in which the air-to-liquid heat exchanger is mounted within the back cover.

11. The apparatus of claim 10 in which the air-to-liquid heat exchanger comprises a plurality of individually hinged elements.

12. The apparatus of claim 7 in which one air-to-liquid heat exchanger is mounted within the front cover, and one air-to-liquid heat exchanger is mounted within the back cover.

13. The apparatus of claim 7 further comprising an inlet auxiliary air-moving device mounted in the supply air flow plenum, and an exit auxiliary air-moving device mounted in the return air flow plenum.

14. The apparatus of claim 8 in which the front cover comprises a plurality of vent panels and an automatic latch mechanism having an over-temperature condition trigger.

15. The apparatus of claim 10 in which the back cover comprises a plurality of vent panels and an automatic latch mechanism having an over-temperature condition trigger.

16. The apparatus of claim 7 in which the connecting duct is in the bottom, the supply air-flow plenum has a converging cross-section, and the return air-flow plenum has a diverging cross-section.

17. The apparatus of claim 16 in which the cabinet further comprises sound-absorbing filler material.

18. The apparatus of claim 7 in which the connecting duct is in the top, the supply air-flow plenum has a converging cross-section, and the return air-flow plenum has a diverging cross-section.

19. The apparatus of claim 7 in which connecting ducts are located in both the top and bottom, and in which both the supply and return air-flow plenums are doubly convergent and doubly divergent respectively.

* * * * *